United States Patent
Zhang et al.

(10) Patent No.: US 9,614,183 B2
(45) Date of Patent: Apr. 4, 2017

(54) ORGANIC LIGHT-EMITTING DIODE DISPLAYS WITH CRACK DETECTION AND CRACK PROPAGATION PREVENTION CIRCUITRY

(71) Applicant: Apple Inc., Cupertino, CA (US)

(72) Inventors: Zhen Zhang, San Jose, CA (US); Lalgudi Bhadrinarayana Visweswaran, Santa Clara, CA (US); Chih Jen Yang, Cupertino, CA (US); Damien S. Boesch, Cupertino, CA (US); Jae Won Choi, Cupertino, CA (US); Paul S. Drzaic, Morgan Hill, CA (US); Stephen S. Poon, San Jose, CA (US); Young Bae Park, San Jose, CA (US)

(73) Assignee: Apple Inc., Cupertino, CA (US)

( * ) Notice: Subject to any disclaimer, the term of this patent is extended or adjusted under 35 U.S.C. 154(b) by 72 days.

(21) Appl. No.: 14/681,834

(22) Filed: Apr. 8, 2015

(65) Prior Publication Data

US 2016/0293884 A1    Oct. 6, 2016

Related U.S. Application Data

(60) Provisional application No. 62/141,748, filed on Apr. 1, 2015.

(51) Int. Cl.
 *H01L 51/52* (2006.01)
 *H01L 27/32* (2006.01)
 (Continued)

(52) U.S. Cl.
 CPC ....... *H01L 51/5253* (2013.01); *G09G 3/3208* (2013.01); *H01L 27/3223* (2013.01);
 (Continued)

(58) Field of Classification Search
 CPC ......... H01L 2251/5338; H01L 51/0097; H01L 27/3276; H01L 51/5253; H01L 27/3244;
 (Continued)

(56) References Cited

U.S. PATENT DOCUMENTS 6,888,307 B2    5/2005    Silvernail et al.
8,710,502 B2    4/2014    Ahn et al.
(Continued)

FOREIGN PATENT DOCUMENTS

CN    103715366    4/2014
EP    2838132    2/2015

*Primary Examiner* — Jany Richardson
(74) *Attorney, Agent, or Firm* — Treyz Law Group, P.C.; Jason Tsai

(57) ABSTRACT

A display may have thin-film transistor (TFT) circuitry on a substrate. An array of organic light-emitting diodes may be formed on the thin-film transistor circuitry. The display may include inorganic brittle layers and organic and metal layers that are ductile and mechanically robust. To help prevent propagation of cracks and other defects along the edge of the display, the display may be provided with crack stop structures and crack detection circuitry. The crack detection circuitry may include one or more loops that are formed along the periphery of the display. The crack stop structures may include TFT/OLED structures formed in a staggered configuration. At least some of the brittle layers can be removed from the panel edge. An additional adhesion layer may also be formed directly on the substrate to help prevent inorganic layers from debonding from the surface of the substrate.

18 Claims, 17 Drawing Sheets

(51) Int. Cl.
*H05B 33/08* (2006.01)
*G09G 3/3208* (2016.01)
*H01L 51/56* (2006.01)

(52) U.S. Cl.
CPC ...... *H01L 27/3244* (2013.01); *H01L 27/3258* (2013.01); *H01L 51/5256* (2013.01); *H01L 51/56* (2013.01); *H05B 33/0896* (2013.01); *G09G 2330/02* (2013.01); *G09G 2330/04* (2013.01); *H01L 2227/323* (2013.01); *H01L 2251/566* (2013.01); *H01L 2251/568* (2013.01)

(58) Field of Classification Search
CPC . H01L 27/3248; H01L 51/5256; H01L 51/56; H01L 27/1218; H01L 27/1259; H01L 51/5246; G09G 3/3208
See application file for complete search history.

(56) References Cited

U.S. PATENT DOCUMENTS

| | | |
|---|---|---|
| 8,748,914 B2 | 6/2014 | Kang et al. |
| 8,772,824 B2 | 7/2014 | Lee et al. |
| 2009/0273589 A1 | 11/2009 | Asano et al. |
| 2014/0054803 A1 | 2/2014 | Chen et al. |
| 2014/0097430 A1 | 4/2014 | Park et al. |
| 2014/0176844 A1* | 6/2014 | Yanagisawa .......... G02F 1/1309 349/43 |
| 2014/0368228 A1 | 12/2014 | Kim |
| 2015/0034935 A1* | 2/2015 | Choi .................... H01L 51/0097 257/40 |
| 2015/0050758 A1 | 2/2015 | Ko et al. |
| 2015/0060778 A1 | 3/2015 | Kim et al. |
| 2015/0311409 A1* | 10/2015 | Huang .................. G02F 1/1333 257/99 |

* cited by examiner

ORGANIC LIGHT-EMITTING DIODE DISPLAYS WITH CRACK DETECTION AND CRACK PROPAGATION PREVENTION CIRCUITRY

This application claims the benefit of provisional patent application No. 62/141,748, filed Apr. 1, 2015 which is hereby incorporated by reference herein in its entirety.

BACKGROUND

This relates generally to electronic devices with displays, and, more particularly, to organic light-emitting diode displays.

Electronic devices often include displays. Displays such as organic light-emitting diode displays have pixels with light-emitting diodes. The light emitting diodes each have electrodes (i.e., an anode and a cathode). Emissive material is interposed between the electrodes. During operation, current passes between the electrodes through the emissive material, generating light.

Organic light-emitting diode displays are manufactured by dicing a mother glass on which multiple instances of individual display panel structures are formed into separate pieces. When cutting along a scribe line to separate two adjacent display panels, cracks or other mechanical issues such as debonding of existing layers in the display structures may be produced. Over time, even small cracks along the edge of the display panel can propagate towards the active display region. Cracks and other defects generated in this way that encroach into the active display region can allow moisture to permeate into the active display region, which results in unpleasant growing dark spots (GDS) that is visible to a user of the electronic device.

It would therefore be desirable to be able to provide organic light-emitting diode displays edge crack propagation prevention structures.

SUMMARY

An organic light-emitting diode display may have an array of light-emitting diodes that form an array of pixels in an active area of the display. The array of pixels may be used to display images for a viewer. Each light-emitting diode may have a layer of emissive material interposed between an anode and a cathode. When current is passed between the anode and the cathode through the emissive material, the light-emitting diode will emit light.

Thin-film transistor circuitry may be used to form pixel circuits that control the current applied through the light-emitting diode of each pixel. The thin-film transistor circuitry may include transistors and thin-film capacitors and may be formed from semiconductor layers, dielectric layers, and metal layers on a substrate.

In accordance with an embodiment, crack stop structures may be formed on the substrate in an inactive area of the display that surrounds the active area, where the crack stop structures are configured to prevent a crack at an edge of the display from propagating into the active area. The crack stop structures may be formed from the thin-film transistor structures and the organic light-emitting diode (OLED) structures arranged in a staggered configuration with a non-homogeneous topology that provides enhanced fracture resistance. Either a blanket inorganic encapsulation layer (e.g., one or more silicon nitride passivation layers) or a plurality of discrete SiN films may be patterned on the crack stop structures.

In accordance with another embodiment, the crack stop structures may include many column (wall) structures formed from the TFT and/or OLED layers. The wall structure width size can be from ~1 um to ~1 mm or other suitable widths. Polymer filler material (e.g., planarization material, pixel definition layer material, spacer material, etc.) may be interposed between the first and second column wall structures. If desired, inorganic and other brittle layers in the column wall structures may be selectively etched away to enhance the rigidity of the column wall structures.

The crack stop structures formed using the TFT/OLED layers may be patterned using photolithographic techniques. In accordance with another suitable embodiment, crack stop structures may also be formed from polymer material using shadow masking techniques. For example, the polymer-based crack stop structures may include a first array of polymer structures and a second array of polymer structures that is staggered with respect to the first array of polymer structures. In particular, a first inorganic encapsulation layer may be interposed between the first array of polymer structures and the second array of polymer structures, whereas a second inorganic encapsulation layer may be formed on the second array of polymer structures. In certain embodiments, an adhesion layer may be formed directly on the substrate, where the inorganic encapsulation layers are formed directly on the adhesion layer. Configured as such, the adhesion layer prevents the inorganic encapsulation layers from debonding from the surface of the substrate.

In accordance with another embodiment, a method for manufacturing an OLED display is provided that includes forming organic light-emitting diodes over a substrate, forming inorganic layers that extend to an edge of the display, and removing a portion of the inorganic layers at the edge of the display to help prevent cracks from propagating from the edge of the display to the organic light-emitting diodes. In particular, the step of removing the portion of the inorganic layers at the edge of the display may include etching away a portion of inorganic buffer layers formed directly on the substrate and a portion of inorganic encapsulation layers that are at least partially formed over the organic light-emitting diodes.

In accordance with yet another embodiment, crack detection circuitry may be formed along at least one edge of the display and may be coupled to a display driver integrated circuit (DIC). As an example, the crack detection circuitry may include a single loop that runs along the periphery of the display. As another example, the crack detection circuitry may include a first sensing path that is formed along a first edge of the display and that is configured to detect for the presence of a crack along the first edge and a second sensing path that is formed along a second edge of the display and that is configured to detect for the presence of a crack along the second edge. The display driver integrated circuit may be configured to power off the display in response to detecting a crack along the at least one edge of the display using the crack detection circuitry. If desired, the crack detection circuitry may be formed as an integral part of the crack stop structures.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

DETAILED DESCRIPTION

Figure 1:
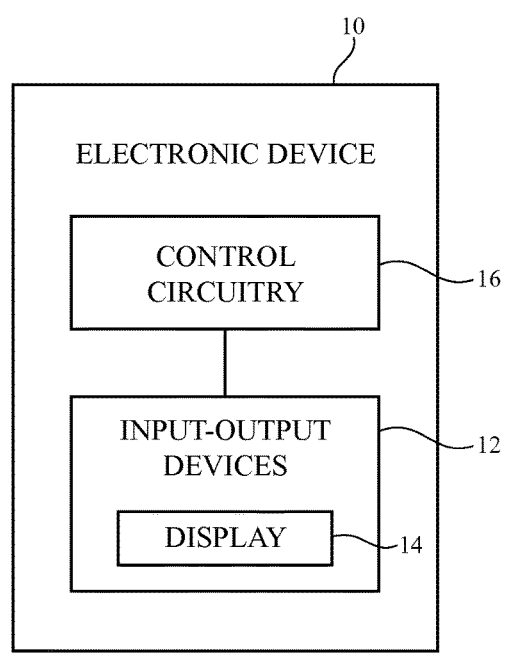
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode display are sometimes described herein as an example. This is, however, merely illustrative. Any suitable type of display may be used, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
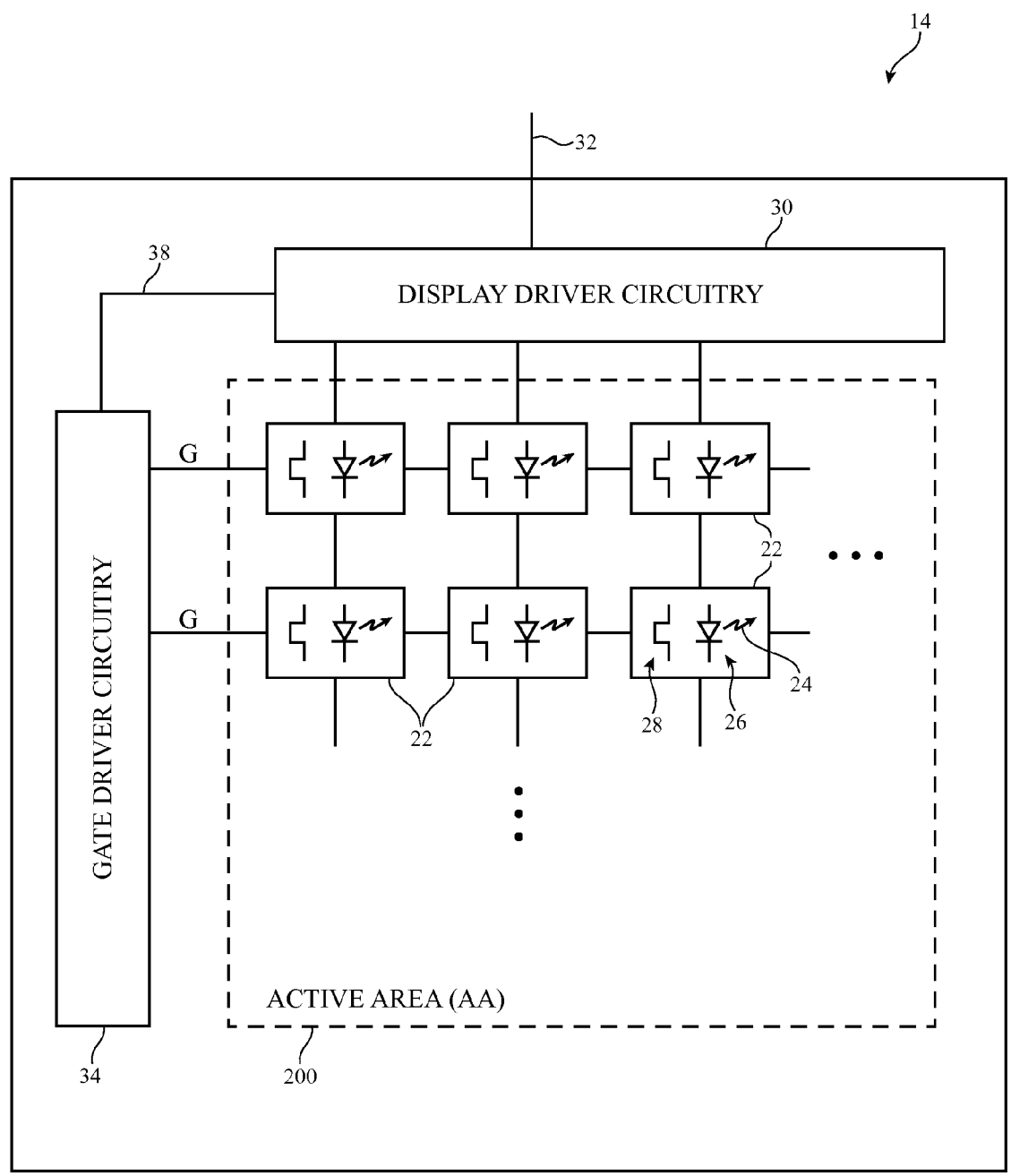
FIG. 2 is a top view of an illustrative display in an electronic device in accordance with an embodiment.

A top view of a portion of display 14 is shown in FIG. 2. As shown in FIG. 2, display 14 may have an array of pixels 22 formed on substrate 36. Substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting-oxide thin-film transistors such as indium zinc gallium oxide transistors, or thin-film transistors formed from other semiconductors. Pixels 22 may contain light-emitting diodes of different colors (e.g., red, green, and blue) to provide display 14 with the ability to display color images.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14.

Gate driver circuitry 34 (sometimes referred to as horizontal control line control circuitry) may be implemented as part of an integrated circuit and/or may be implemented using thin-film transistor circuitry. Horizontal control lines G in display 14 may carry gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

The region on display 14 where the display pixels 22 are formed may sometimes be referred to herein as the active area (AA) 200. The region surrounding the active area 200 wherein peripheral circuitry such as the gate driver circuitry 34 and the display driver circuitry 30 can be formed is therefore sometimes referred to as the inactive area (IA). Images can only be displayed to a user of the device in the active region.

Figure 3:
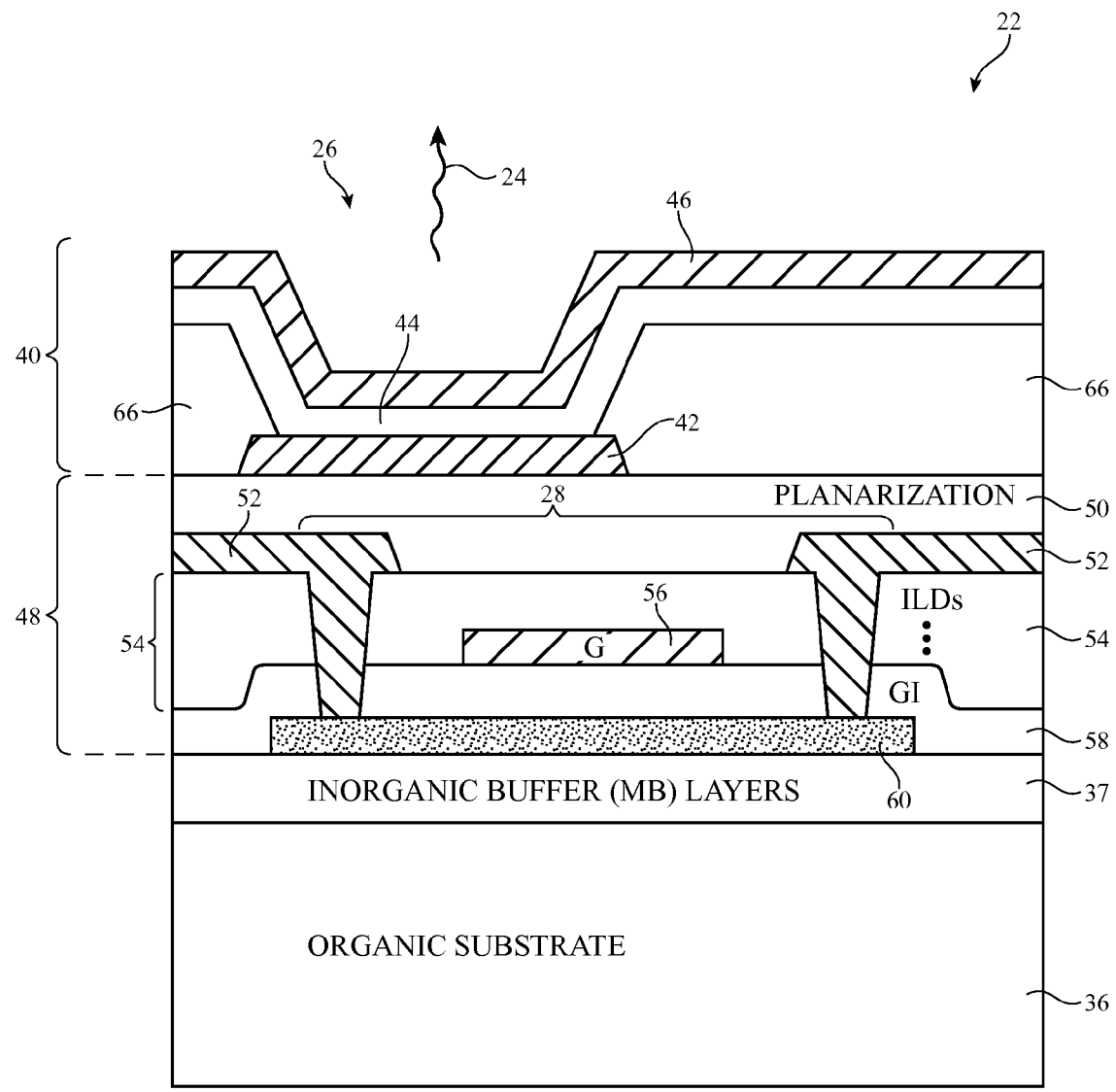
FIG. 3 is a cross-sectional side view of a portion of an illustrative organic light-emitting diode display in accordance with an embodiment.

A cross-sectional side view of an illustrative organic light-emitting diode display is shown in FIG. 3. As shown in FIG. 3, display 14 may include a substrate layer such as substrate layer 36. Substrate 36 may be a planar layer or a non-planar layer and may be formed from plastic, glass, ceramic, sapphire, metal, or other suitable materials. In the example of FIG. 3, substrate 36 may be an organic substrate formed from polyimide (PI), polyethylene terephthalate (PET), or polyethylene naphthalate (PEN) (as examples). The surface of substrate 36 may, if desired, be covered with one or more buffer layers 37 (e.g., inorganic buffer layers such as layers of silicon oxide, silicon nitride, etc.). Buffer layers 37 are sometimes referred to as multi-buffer (MB) layers.

Thin-film transistor (TFT) circuitry 48 may be formed on buffer layers 37. Thin-film transistor circuitry 48 may include transistors, capacitors, and other thin-film structures. As shown in FIG. 3, a transistor such as transistor 28 may be formed from thin-film semiconductor layer 60 in thin-film transistor layers 48. Semiconductor layer 60 may be a polysilicon layer, a semiconducting-oxide layer such as a layer of indium gallium zinc oxide, or other semiconductor layer. Gate layer 56 may be a conductive layer such as a metal layer that is separated from semiconductor layer 60 by an intervening layer of dielectric such as dielectric 58 (e.g., an inorganic gate insulator layer such as a layer of silicon oxide).

Semiconductor layer 60 of transistor 28 may be contacted by source and drain terminals formed from source-drain metal layer 52. One or more dielectric layers 54 (e.g., inorganic dielectric layers sometimes referred to as interlayer dielectric or "ILD" layers) may separate gate metal layer 56 from source-drain metal layer 52. Source-drain metal layer 52 may be shorted to anode 42 of light-emitting diode 26 using a metal via that passes through a dielectric planarization layer 50. Planarization layer 50 may be formed from an organic dielectric material such as a polymer.

Light-emitting diode 26 may be formed from light-emitting diode layers 40 on thin-film transistor layers 48. Each light-emitting diode has a lower electrode and an upper electrode. In a top emission display, the lower electrode may be formed from a reflective conductive material such as patterned metal to help reflect light that is produced by the light-emitting diode in the upwards direction out of the display. The upper electrode (sometimes referred to as the counter electrode) may be formed from a transparent or semi-transparent conductive layer (e.g., a thin layer of transparent or semitransparent metal and/or a layer of indium tin oxide or other transparent conductive material). This allows the upper electrode to transmit light outwards that has been produced by emissive material in the diode. In a bottom emission display, the lower electrode may be transparent (or semi-transparent) and the upper electrode may be reflective.

In configurations in which the anode is the lower electrode, layers such as a hole injection layer, hole transport layer, emissive material layer, and electron transport layer may be formed above the anode and below the upper electrode, which serves as the cathode for the diode. In inverted configurations in which the cathode is the lower electrode, layers such as an electron transport layer, emissive material layer, hole transport layer, and hole injection layer may be stacked on top of the cathode and may be covered with an upper layer that serves as the anode for the diode. Both electrodes may reflect light.

In general, display 14 may use a configuration in which the anode electrode is closer to the display substrate than the cathode electrode or a configuration in which the cathode electrode is closer to the display substrate than the anode electrode. In addition, both bottom emission and top emission arrangements may be used. Top emission display configurations in which the anode is located on the bottom and the cathode is located on the top are sometimes described herein as an example. This is, however, merely illustrative. Any suitable display arrangement may be used, if desired.

In the illustrative configuration of FIG. 3, display 14 has a top emission configuration and lower electrode 42 is an anode and upper electrode 46 is a cathode. Layers 40 include a patterned metal layer that forms anodes such as anode 42. Anode 42 is formed within an opening in pixel definition layer (PDL) 66. Pixel definition layer 66 may be formed from a patterned photoimageable polymer. In each light-emitting diode 26, organic emissive material 44 is interposed between a respective anode 42 and cathode 46. Anodes 42 may be patterned from a layer of metal on thin-film transistor layers 48 such as on planarization layer 50. Cathode 46 may be formed from a common conductive layer that is deposited on top of pixel definition layer 66. Cathode 46 is transparent so that light 24 may exit light emitting diode 26 as current is flowing through emissive material 44 between anode 42 and cathode 46.

Figure 4A:
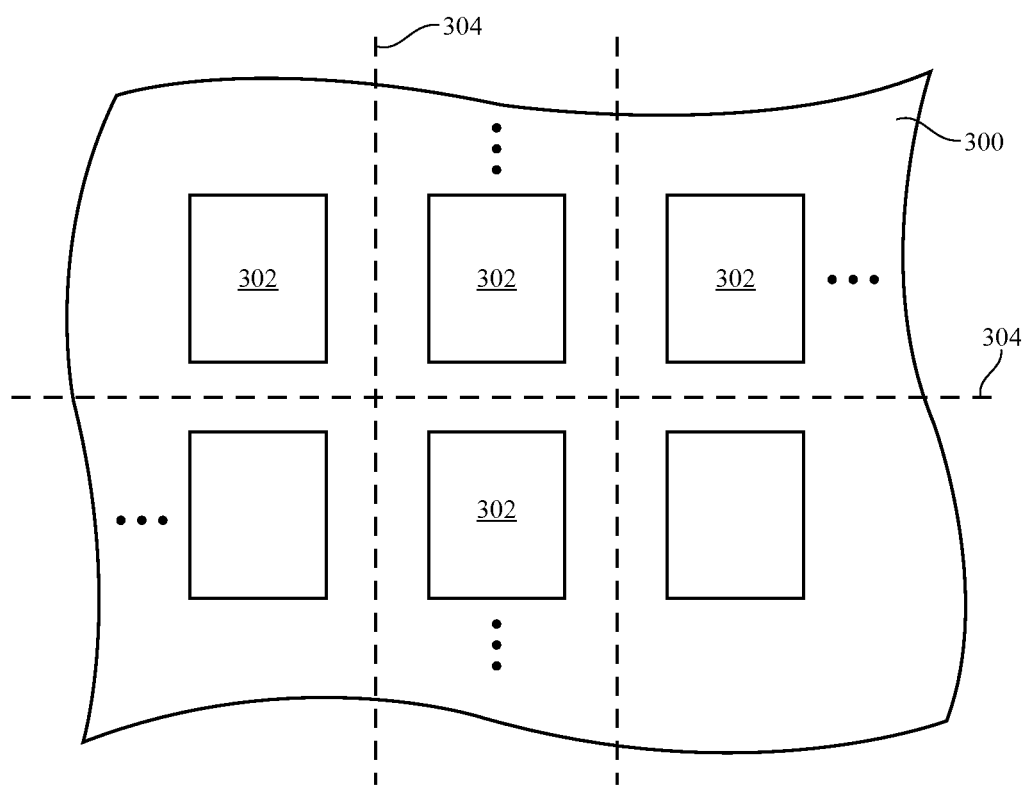
FIG. 4A is a diagram showing how a display mother glass can be diced into multiple display panel cells in accordance with an embodiment.

FIG. 4A is a diagram showing how a display mother glass 300 can be diced into multiple display panel cells 302 in accordance with an embodiment. As shown in FIG. 4, glass cutting equipment may be used to slice mother glass 300 along scribe lines 304 to separate the mother glass into individual display panel cells 302 (e.g., similar to how an integrated circuit wafer can be diced into multiple individual integrated circuit dies).

Figure 4B:
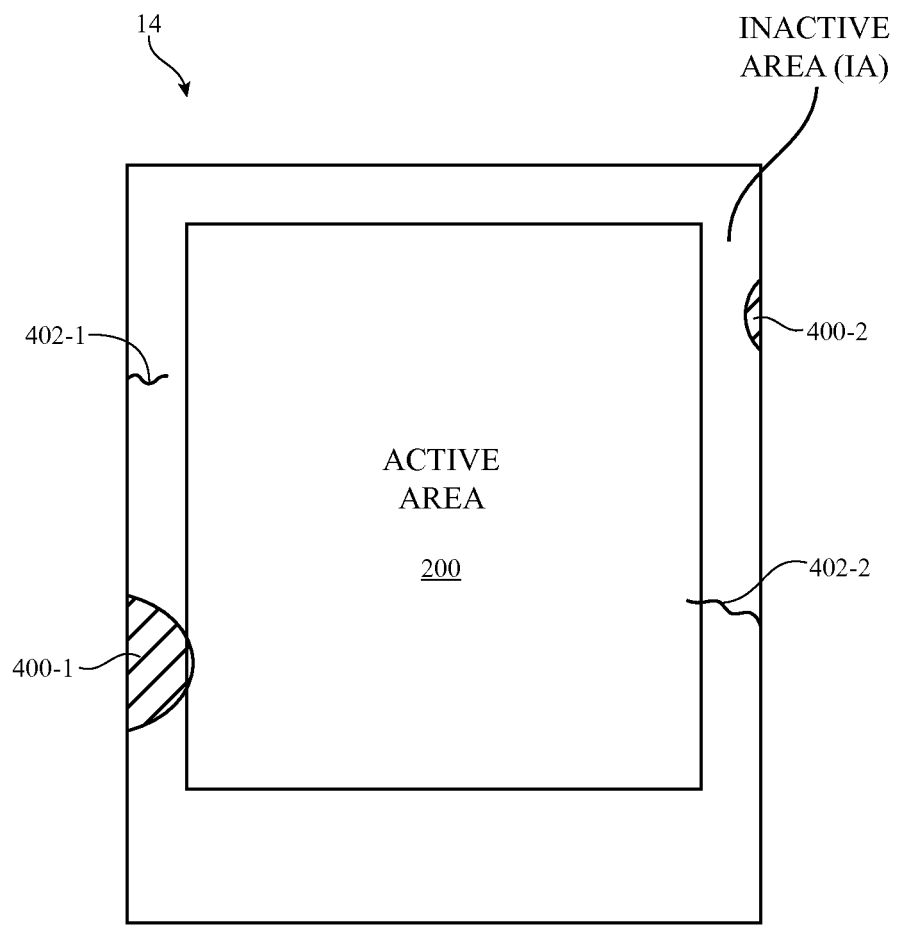
FIG. 4B is a top view of an illustrative display showing how cracks and other mechanical defects can encroach into the active display area in accordance with an embodiments.

During dicing operations, however, the cutting motion can potentially result in cracks, debonding of certain interfaces in the display stackup (e.g., layers that are formed on the substrate may become delaminated due to the stress induced by the dicing operation), and/or other mechanical defects at one or more edges of the display. Some of these defects are illustrated in FIG. 4B. As shown in FIG. 4B, channel/tunnel cracks 402-1 and 402-2 and debonding regions 400-1 and 400-2 may exist along the edges of display 14. Smaller defects such as crack 402-1 and debonding region 400-2 that do not encroach into the active display region 200 might be initially tolerable. Over time however, these defects can expand and propagate into the active display region (similar to crack 402-2 and debonding region 400-1 in the example of FIG. 4B). In such scenarios, it is possible for moisture to permeate into the display pixels, which can result in growing dark spots (GDSs) and other undesirable visual artifacts to be visible to the user.

Figure 5A:
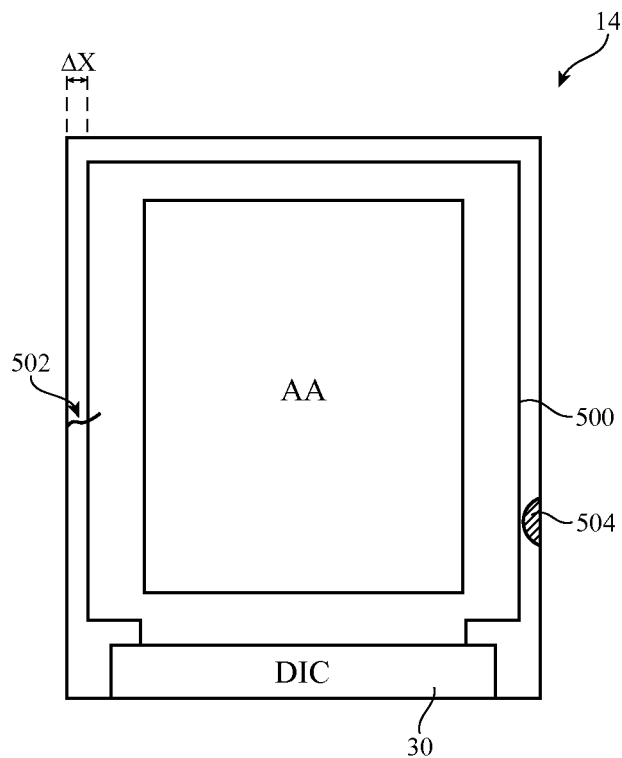
FIG. 5A is top view showing one suitable embodiment of a crack detection structure having one loop for detecting defects along the periphery of the display.

FIG. 5A is top view showing one suitable embodiment of a crack detection structure having one loop for detecting defects along the periphery of the display. As shown in FIG. 5A, a single sensing path 500 can be formed that runs along the edge of display 14 and is coupled to driver integrated circuit (DIC) 30. Configured in this way, any defect that extends a predetermined distance Δx from the panel edge will cause the sensing path 500 to be broken or otherwise disturbed from its nominal state. For example, the crack detection circuitry may yield a first measured value (e.g., a first measured resistance) when a crack is present and a second measured value (e.g., a second measured resistance) that is different than the first measured value when the crack is absent. In the example of FIG. 5A, crack 502 may result in an open circuit to be formed in the sensing path 500. In response to detecting the open circuit (e.g., by sensing a change in the measured resistance), the driver IC 30 may be configured to issue a warning. This can help designers of display 14 to debug the design of the inactive border region and to refine the manufacturing/assembling handling procedures. During normal operation, any abnormal behavior on sensing path 500 can also trigger the driver IC 30 to power off display 14 to prevent a potential power line short circuit induced by a crack from permanently damaging the display.

Figure 5B:
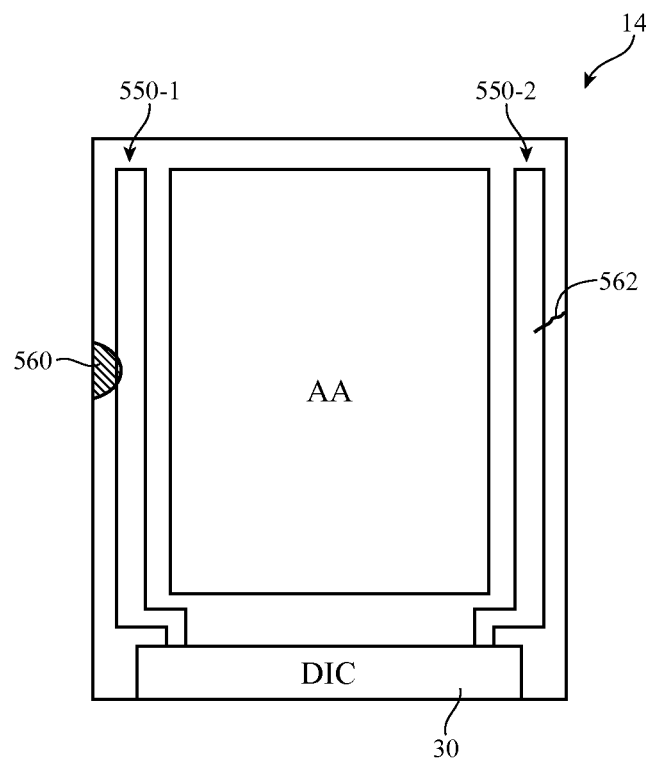
FIG. 5B is a top view showing another suitable embodiment of a crack detection structure having two loops for detecting defects along opposing edges of the display.

FIG. 5B is a top view showing another suitable embodiment of a crack detection structure having two loops for independently detecting defects along opposing edges of the display. As shown in FIG. 5B, a first sensing path 550-1 may be formed along a first edge of display 14, whereas a second sensing path 550-2 may be formed along a second edge of the display. First path 550-1 may serve to detect defects such as debonding region 560 in the left border region of display 14, whereas second path 550-2 may serve to detect defects such as cracks 562 in the right border region of display 14. The left and right sensing paths are able to operate independently of one another and can therefore be used to determine whether a defect is detected along a specific edge of the display (e.g., either the left edge or the right edge or possibly both). The examples of FIGS. 5A and 5B are merely illustrative. If desired, other types of crack/defect detection circuitry can be implemented to detect abnormalities along at least one edge of the display, at least two edges of the display, at least three edges of the display, or at least four edges of the display.

Figure 6:
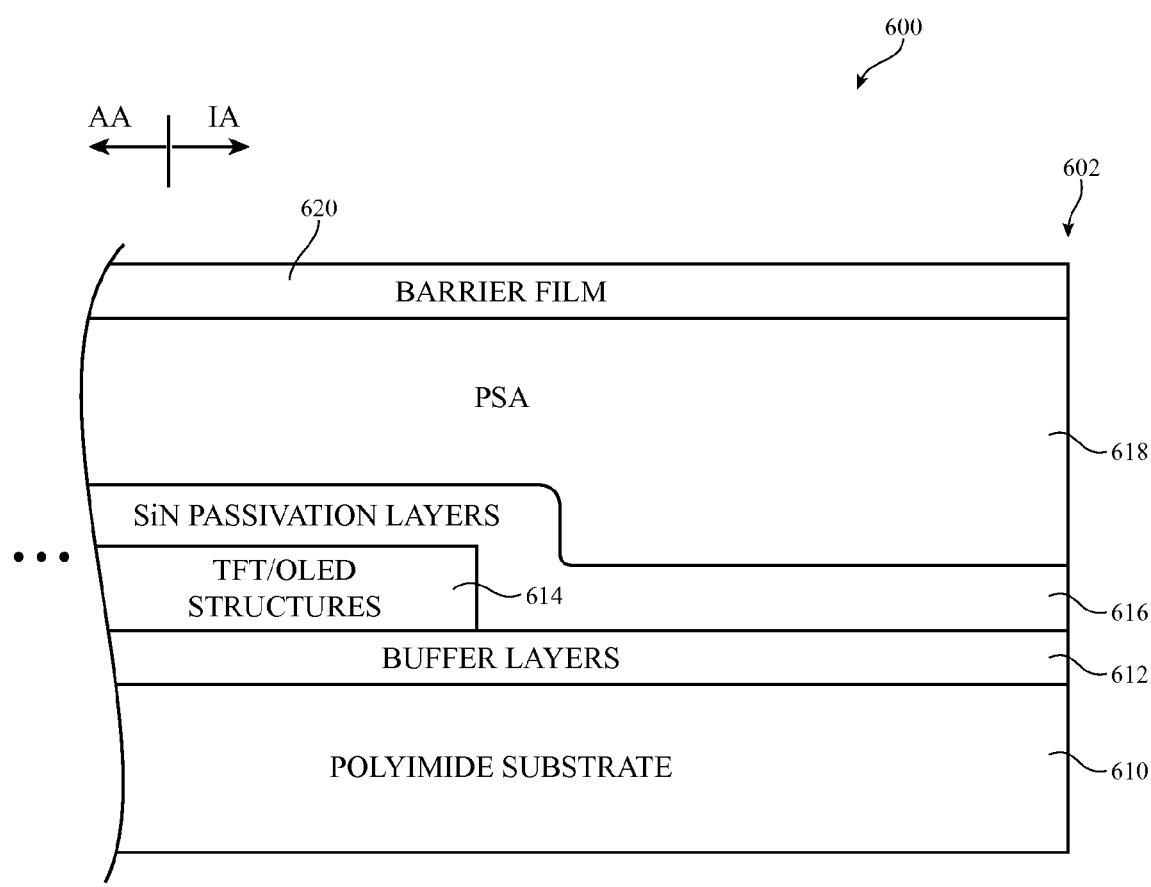
FIG. 6 is a cross-sectional side view of an edge portion of a conventional organic light-emitting diode display.

FIG. 6 is a cross-sectional side view of an edge portion of a conventional organic light-emitting diode display. As shown in FIG. 6, display 600 includes a polyimide substrate 610, inorganic buffer layers 612 formed on the polyimide substrate 610, thin-film transistor TFT) and organic light-emitting diode (OLED) structures 614 formed partially on buffer layers 616, silicon nitride (SiN) passivation layers 616 formed on the TFT/OLED structures 614 and the exposed buffer layers 612, pressure sensitive adhesive (PSA) material 618 formed over the SiN passivation layers 616, and a barrier film 620 formed on the PSA material 618. In this conventional design, the buffer layers 612 and the SiN passivation layers 616 (both of which are brittle inorganic layers) extend all the way to the panel edge 602 of the display. During the scribing and cell breaking process described above in connection with FIG. 4A, edge flaws such as cracking and chipping are able to propagate relatively easily along the brittle inorganic layers from the inactive region into the active area (AA) of display 600 since the fracture resistance of homogenous layers 612 and 616 are relatively low.

Figure 7:
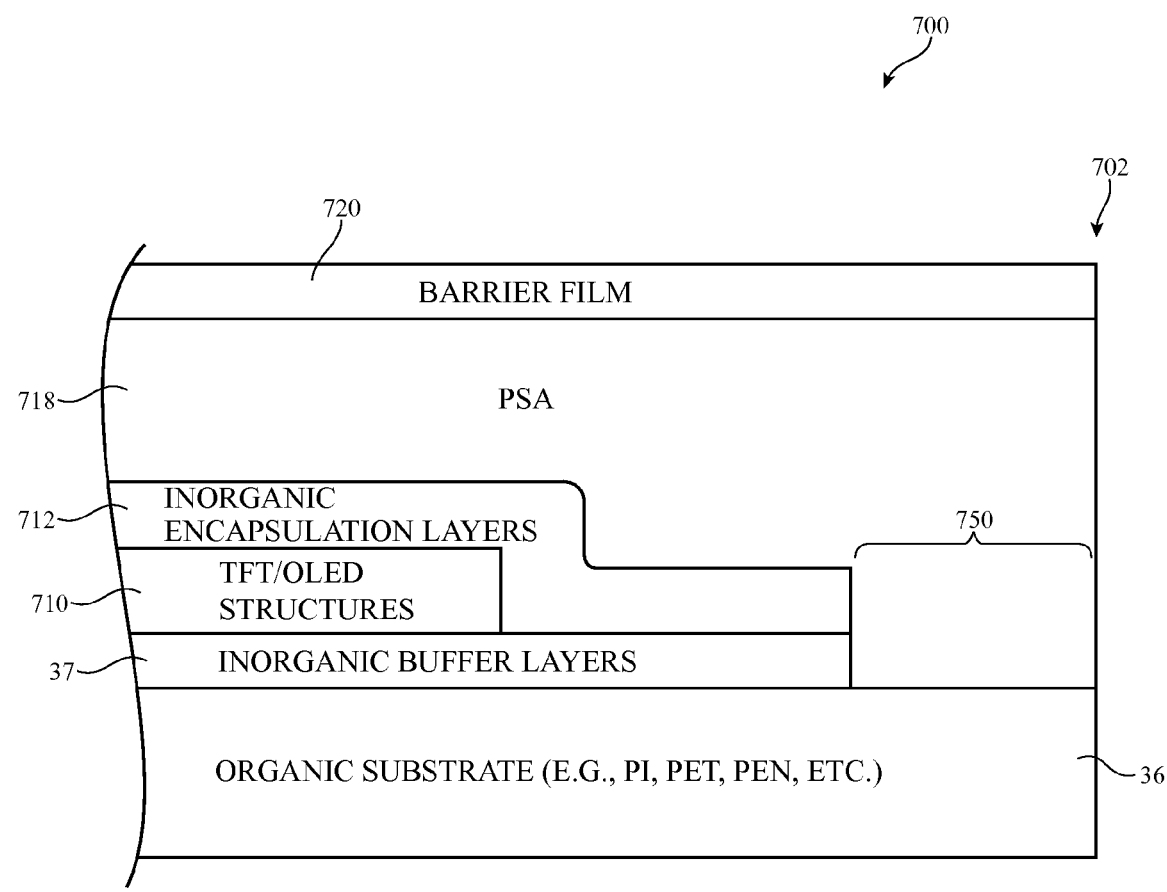
FIG. 7 is a cross-sectional side view of an illustrative organic light-emitting diode display having an edge portion where inorganic brittle layers are removed in accordance with an embodiment.

In accordance with an embodiment, at least some of the inorganic brittle layers can be etched away from the panel scribing line edge. FIG. 7 is a cross-sectional side view of an illustrative organic light-emitting diode display 700 with an edge portion where the inorganic brittle layers have been removed near panel edge 702. As shown in FIG. 7, inorganic buffer layers 37 (e.g., layers of silicon oxide, silicon nitride, etc.) may be formed on substrate 36. Thin-film transistor (TFT) circuitry such as circuitry 48 of the type shown in FIG. 3 and organic light-emitting diode (OLED) circuitry such as circuitry 40 of the type shown in FIG. 3 (referred to collectively as TFT/OLED structures 710) may be formed on buffer layers 37. Inorganic encapsulation layers 712 (e.g., one or more silicon nitride layers, silicon oxide layers, etc.) may be formed over structures 710 and layers 37 to serve as moisture barrier structures. Pressure sensitive adhesive (PSA) material 718 and a barrier film 720 may then be formed over the substrate 36.

In the example of FIG. 7, a portion of buffer layers 37 and encapsulation layers 712 may be removed from edge region 750. This is merely illustrative. In general, any organic or otherwise brittle material may be removed or etched away from region 750 while any organic or otherwise ductile material such as polymer or metal structures may be left intact in region 750. By keeping the brittle material away from edge 702, the propagation of cracks towards the active region of display 700 can be mitigated. The dimensions of region 750 can also be tuned to provide the desired growing dark spot failure control. For example, the edge of the inorganic buffer/encapsulation layers may be placed closer to a mechanical neutral plane, which can help reduce the mechanical strain on the edge layers when a mechanical stress is applied.

Figure 8A:
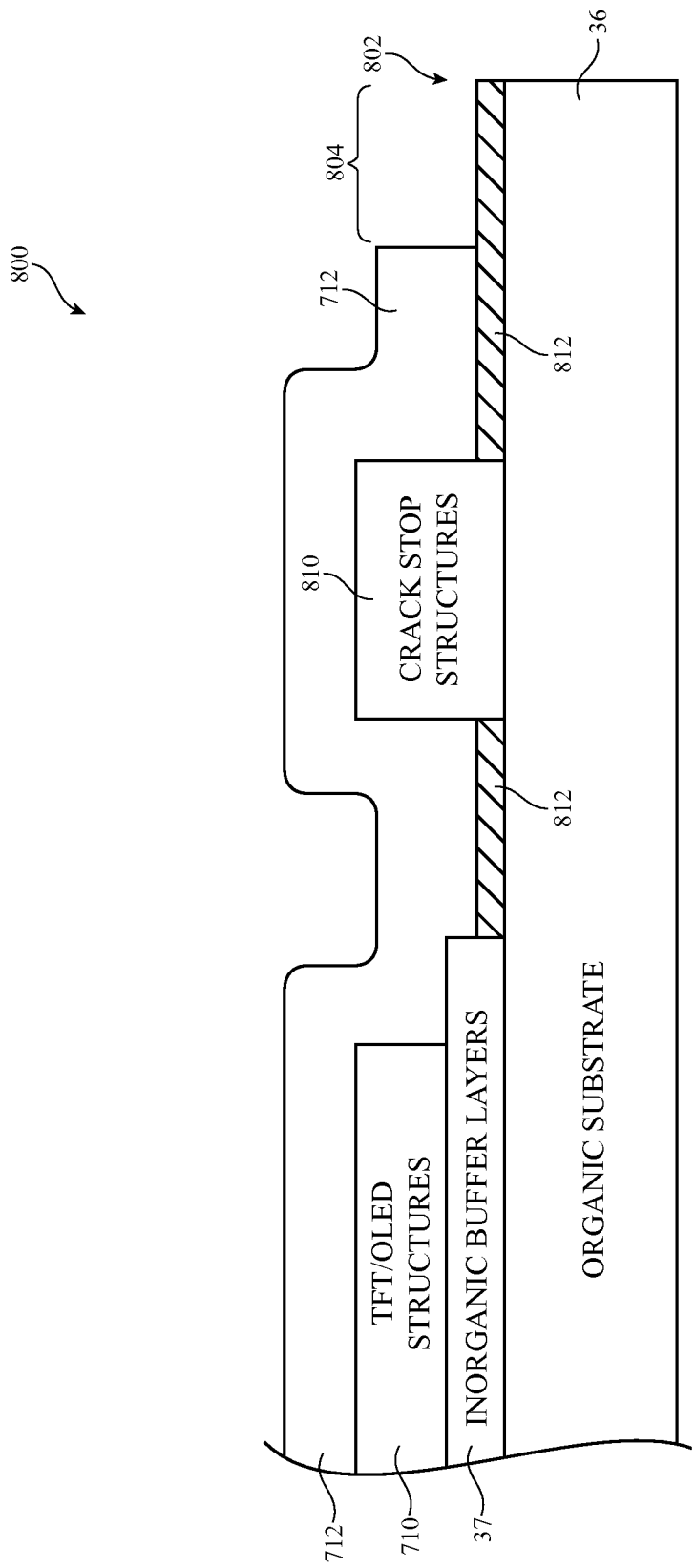
FIG. 8A is a cross-sectional side view of an illustrative organic light-emitting diode display having crack stop structures in accordance with an embodiment.

In accordance with another suitable embodiment, crack stop structures may be formed near the panel edge to help prevent crack propagation. FIG. 8A is a cross-sectional side view of an illustrative organic light-emitting diode display 800 with an edge portion on which crack stop structures 810 are formed. As shown in FIG. 8A, the crack stop structures 810 may be formed separately from the inorganic buffer layers 37 in the active area and may be formed directly on substrate 36. Encapsulation layers 712 may also extend beyond the buffer layers 37 and cover crack stop structures 810. Panel edge region 804 may still be devoid of encapsulation layers 37 for the same reasons as described above in connection with FIG. 7.

If desired, an adhesion layer such as adhesion layer 812 may be formed at the surface of substrate 36 to improve the adhesion between the inorganic encapsulation layers 712 and the organic substrate 36 in the inactive area (i.e., to help prevent encapsulation layers 712 from being delaminated from substrate 36 when stress is applied to display 800). Adhesion layer 812 may be metals, oxides, or other suitable materials with relatively low thickness (e.g., less than 100 nm). In general, it may be desirable for adhesion layer 812 to extend all the way towards panel edge 802 to help minimize the chance of delamination at the substrate/encapsulation interface.

Figure 8B:
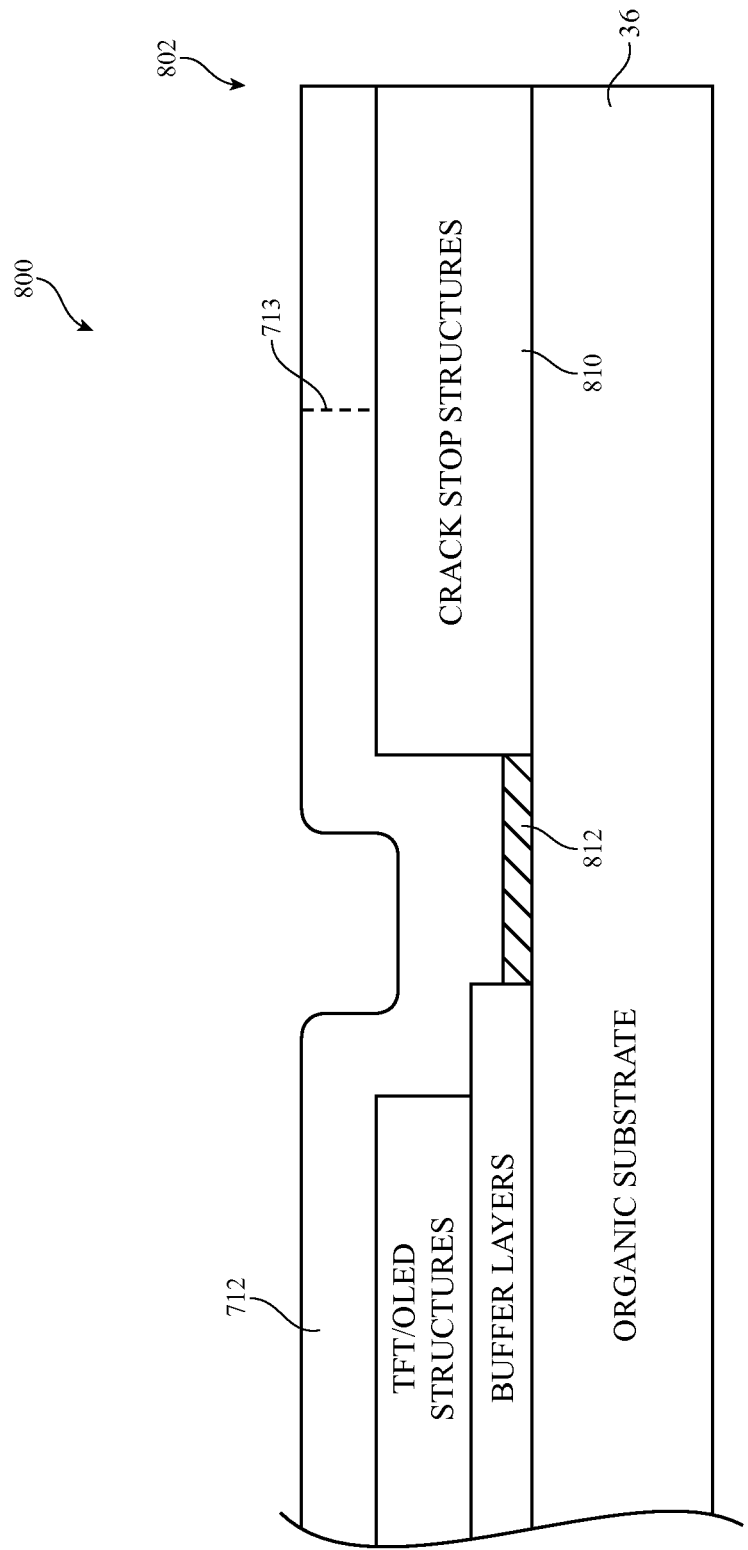
FIG. 8B is a cross-sectional side view showing how crack stop structures may extend all the way to the display panel edge in accordance with an embodiment.

FIG. 8B shows another suitable arrangement in which crack stop structures 810 extend all the way to the edge 802 of display 800. In this configuration, the inorganic encapsulation layers 712 may also extend to panel edge 802 or may only partially cover the crack stop structures 810, as indicated by dotted edge 713.

Figure 8C:
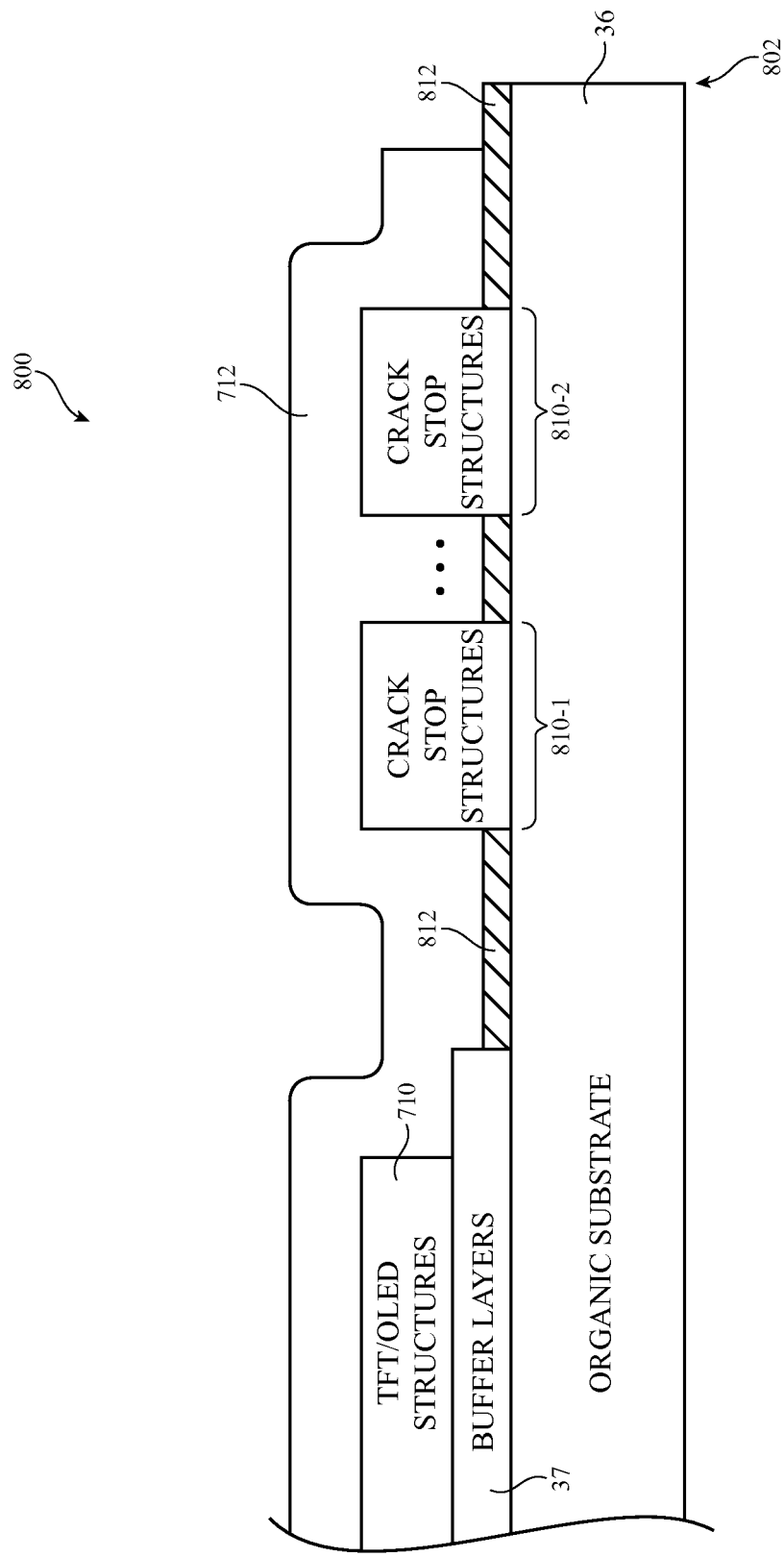
FIG. 8C is a cross-sectional side view showing how two or more separate crack stop structures may be formed at the display periphery in accordance with an embodiment.

FIG. 8C shows yet another suitable arrangement in which two or more crack stop structures 810 may be formed near the edge 802 of display 800. For example, at least first crack stop structures 810-1 and second crack stop structures 810-2 that are physically separate from the first crack stop structures 810-2 may be formed directly on substrate 36. This is merely illustrative. In general, two or more non-continuous crack stop structures may be formed in this way, three or more non-continuous crack stop structures may be formed in this way, etc. If desired, the separate crack stop structures may be formed all the way to edge 802 of display 800. If desired, the inorganic encapsulation layers 712 may only partially cover the substrate 36 (as shown) or may extend all the way to panel edge 802.

Figure 9:
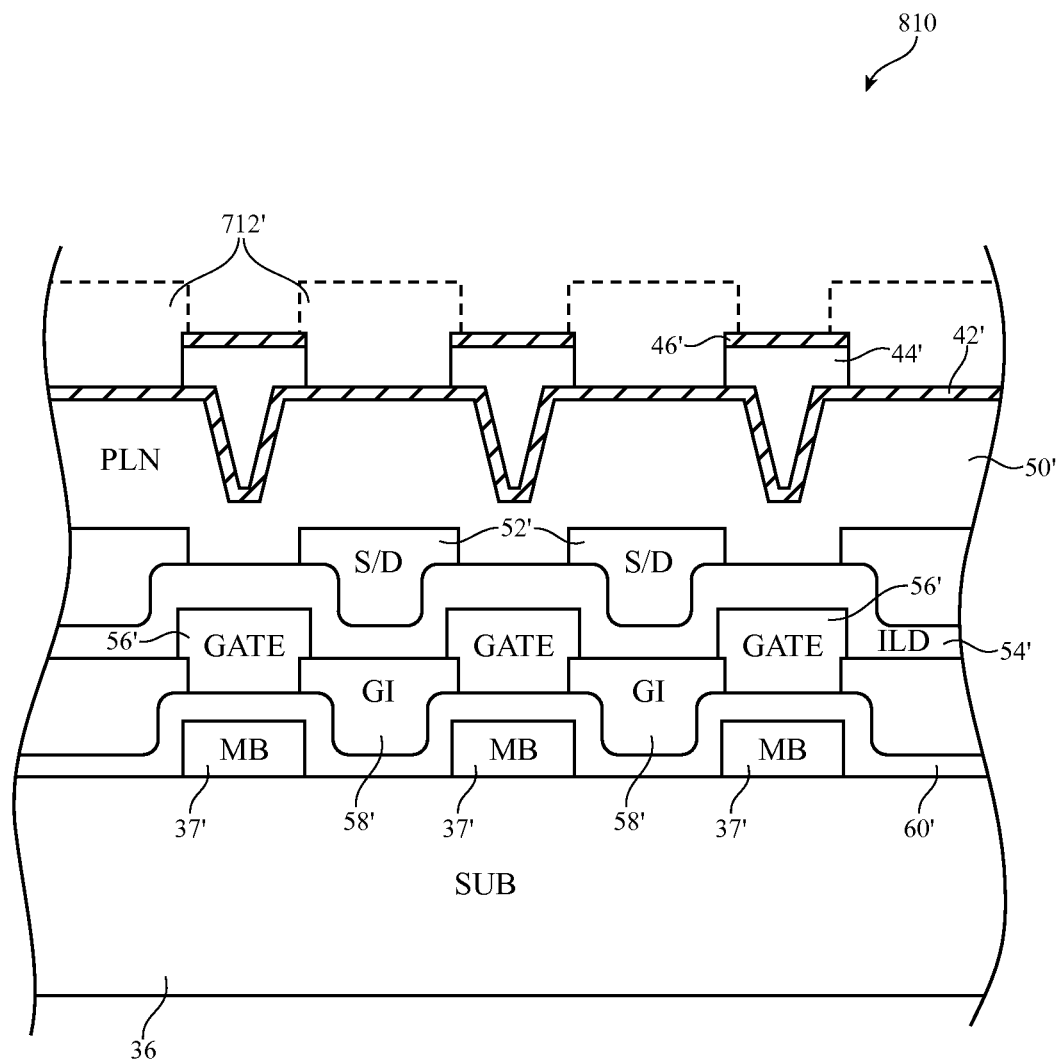
FIG. 9 is a cross-sectional side view of illustrative crack stop structures formed using thin-film transistor circuitry arranged in a staggered configuration in accordance with an embodiment.

FIG. 9 shows one suitable implementation of crack stop structures 810. Since the TFT and OLED layers (e.g., layers 48 and 40 in FIG. 3, respectively) can be patterned using photolithography techniques, these layers can be patterned with relatively high resolution (e.g., with approximately 1 μm resolution) to create a staggered structure. As shown in FIG. 9, all the different TFT and OLED layers such as the multi-buffer (MB) layer 37', semiconductor layer 60', gate insulating (GI) layer 58', gate layer 56', ILD layer(s) 54', source-drain (S/D) layer 52', planarization layer 50', anode layer 42', emissive layer 44, and cathode layer 46' may be formed as separate strips or islands in a staggered arrangement so as to form "hills" and "valleys" in crack stop structures 810. If desired, the crack detection sensing line(s) described in connection with FIGS. 5A and 5B may be formed out of any one of conductive member within crack stop structures 810 (e.g., from semiconductor material 60', gate metal 56', source-drain metal 52', anode layer 42', cathode layer 46', etc.). In other words, the crack detection circuitry may be formed as an integral part of the crack stop structures 810. A staggered configuration generally provides enhanced fracture resistance compared to homogenous material or simple blanket layers. Crack stop structures 810' manufactured as such can therefore help substantially reduce channel/tunnel crack propagation and debonding/delamination propagation into the active display portion of the display.

Blanket encapsulation layers such as layers 712 of FIG. 8A may be deposited over crack stop structures 810 of FIG. 9. Alternatively, a shadow mask may be used to pattern the encapsulation layers to form staggered encapsulation films 712' (shown as dotted features in FIG. 9). In other words, a plurality of non-overlapping discrete inorganic encapsulation films 712' can be patterned using shadow masking techniques. Doing so can further enhance the fracture resistance of the crack stop structures 810.

Figure 10:
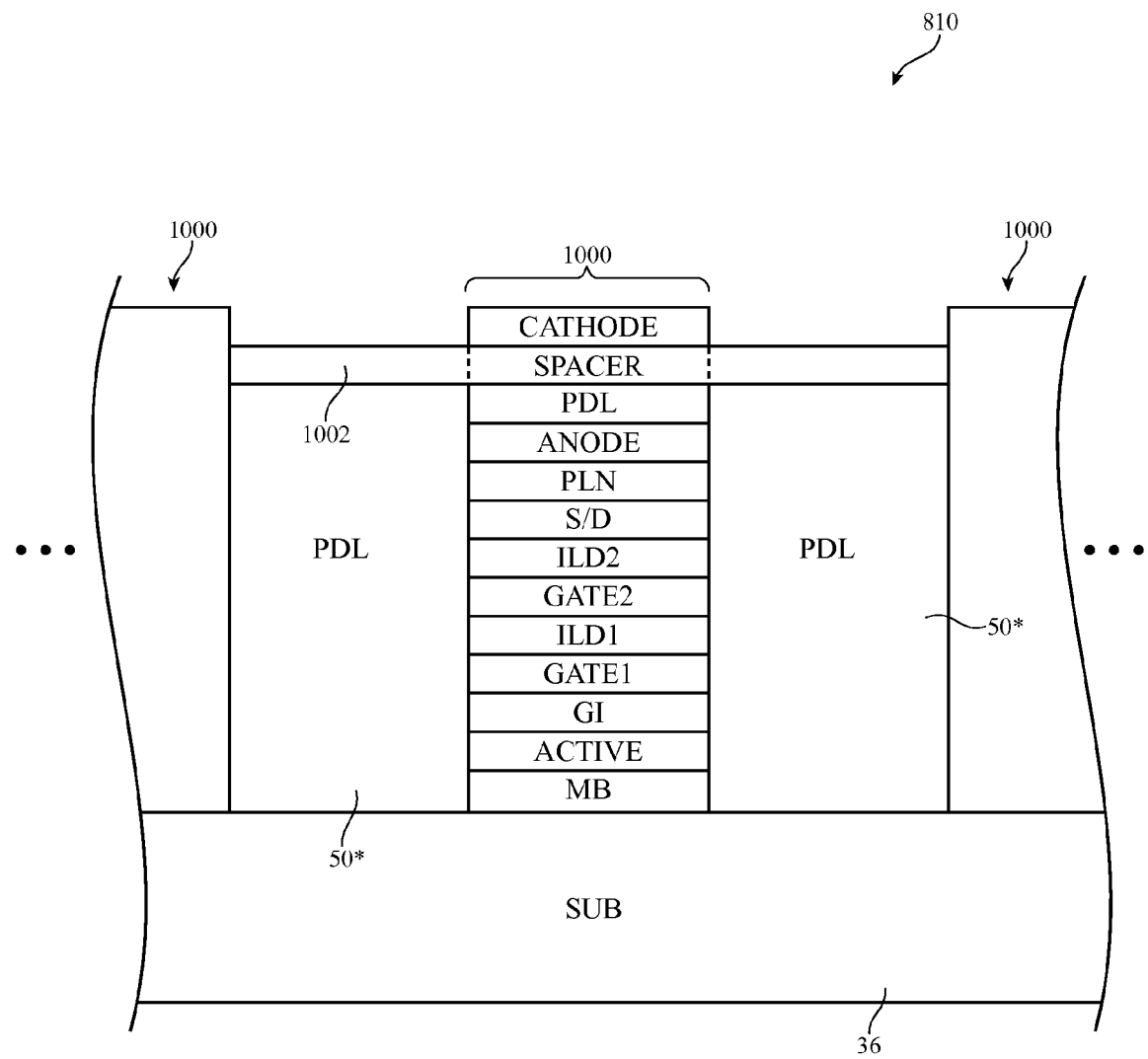
FIG. 10 is a cross-sectional side view of illustrative crack stop structures that includes one or more thin-film transistor (TFT) column structures and interposing polymer filler material in accordance with an embodiment.

FIG. 10 shows another suitable implementation of crack stop structures 810. As shown in FIG. 10, crack stop structures 810 may include one or more column or "wall" structures 1000. Each column structure 1000 may include the various TFT and OLED layers (e.g., including at least some of the multi-buffer layers, the active semiconductor layer, the gate insulating layer, a gate metal layer and associated dielectric layers (labeled as ILD1), one or more additional gate metal layers and associated dielectric layers (labeled as ILD2), source-drain metal layers, a planarization (PLN) layer, an anode layer, a pixel definition layer (PDL), a spacer layer 1002, and a cathode layer).

Regions between adjacent column structures 1000 may be filled using ductile polymer material such as the PDL material 50*, the PLN material, spacer, a combination of these materials, and/or other types of organic material. A plurality of column structures 1000 within crack stop structures 810 configured in this way can also help provide enhanced fracture resistance by blocking crack propagation using wall structures 1000 and absorbing excess stress using filler material 50*. If desired, at least some of the brittle inorganic layers in column structures 1000 may be etched away while the more mechanically robust layers (e.g., the gate metal layers, the S/D metal layers, the planarization layer, the pixel defining layer, the anode layer, the cathode layer, the spacer layer 1002, etc.) are left intact to further enhance the crack propagation prevention capability of structures 810. As with the embodiment of FIG. 9, blank encapsulation layers or patterned encapsulation films (using shadow masks) may be formed over crack stop structures 810 of FIG. 10. If desired, the crack detection sensing line(s) described in connection with FIGS. 5A and 5B may be formed out of any one of conductive member within crack stop structures 810 of FIG. 10.

In the embodiments of FIG. 9 and FIG. 10, the crack stop structure may only consist of polymer and metal layers during TFT/OLED process, since most of polymers and metals are ductile and can help resist cracking/debonding propagation.

Figure 11A:
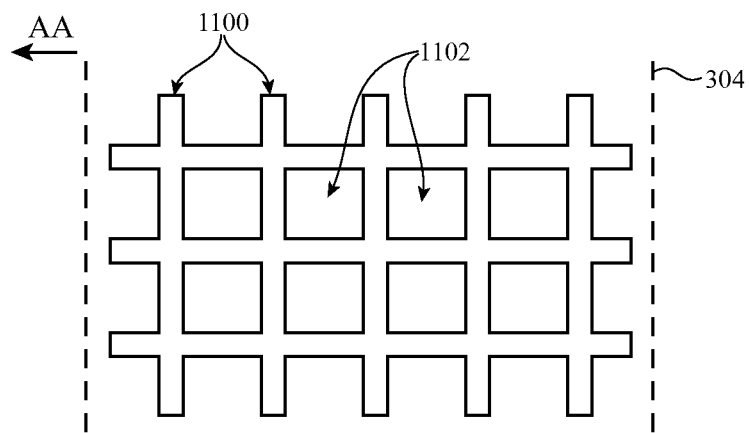
FIGS. 11A-11D are top views showing different ways in which crack stop structures can be patterned over a substrate in accordance with some embodiments.

FIGS. 11A-11D are top views showing different ways in which crack stop structures (e.g., the crack stop structures of FIGS. 8-10) can be patterned over a substrate in accordance with some embodiments. As shown in FIG. 11A, the crack stop structures may be formed in a regular grid-like pattern between the scribe line 304 and the active area AA. In particular, the dark lines 1100 may represent the "hills" in the non-homogenous staggered structure, whereas the gaps 1102 between the dark lines may represent the "valleys" or grooves between the hills.

Figure 11B:
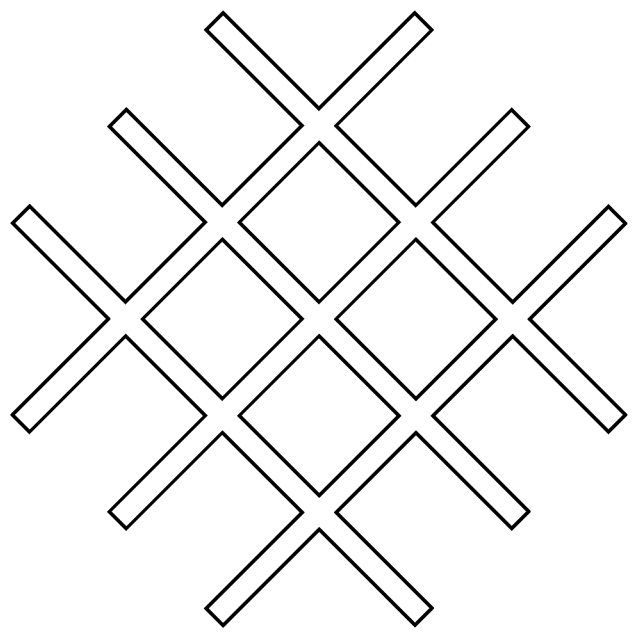
Figure 11C:
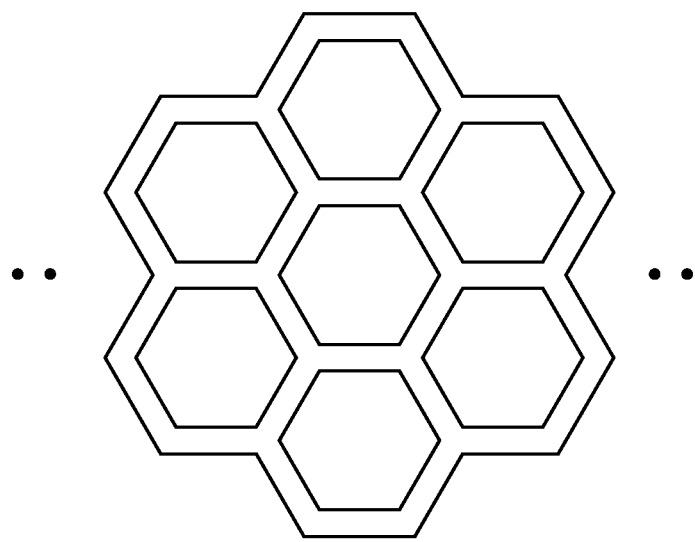
Figure 11D:
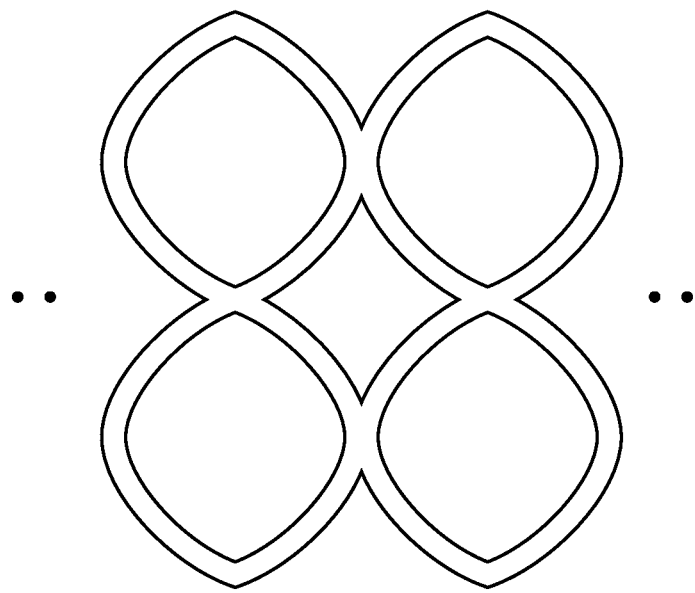

FIG. 11B shows another suitable arrangement where the grid-like pattern is rotated approximately 45 degrees or other angles relative to the configuration of FIG. 11A. FIG. 11C shows yet another suitable arrangement in which the crack stop structures may be formed in a hexagonal honeycomb-like pattern. In general, the crack stop structures may be arranged in sine-wave patterns (see, e.g., the embodiment of FIG. 11D), a regular octagonal pattern, a regular pentagonal pattern, other suitable repeating patterns, as one or more striping patterns, as one or more separate islands, etc.

Figure 12:
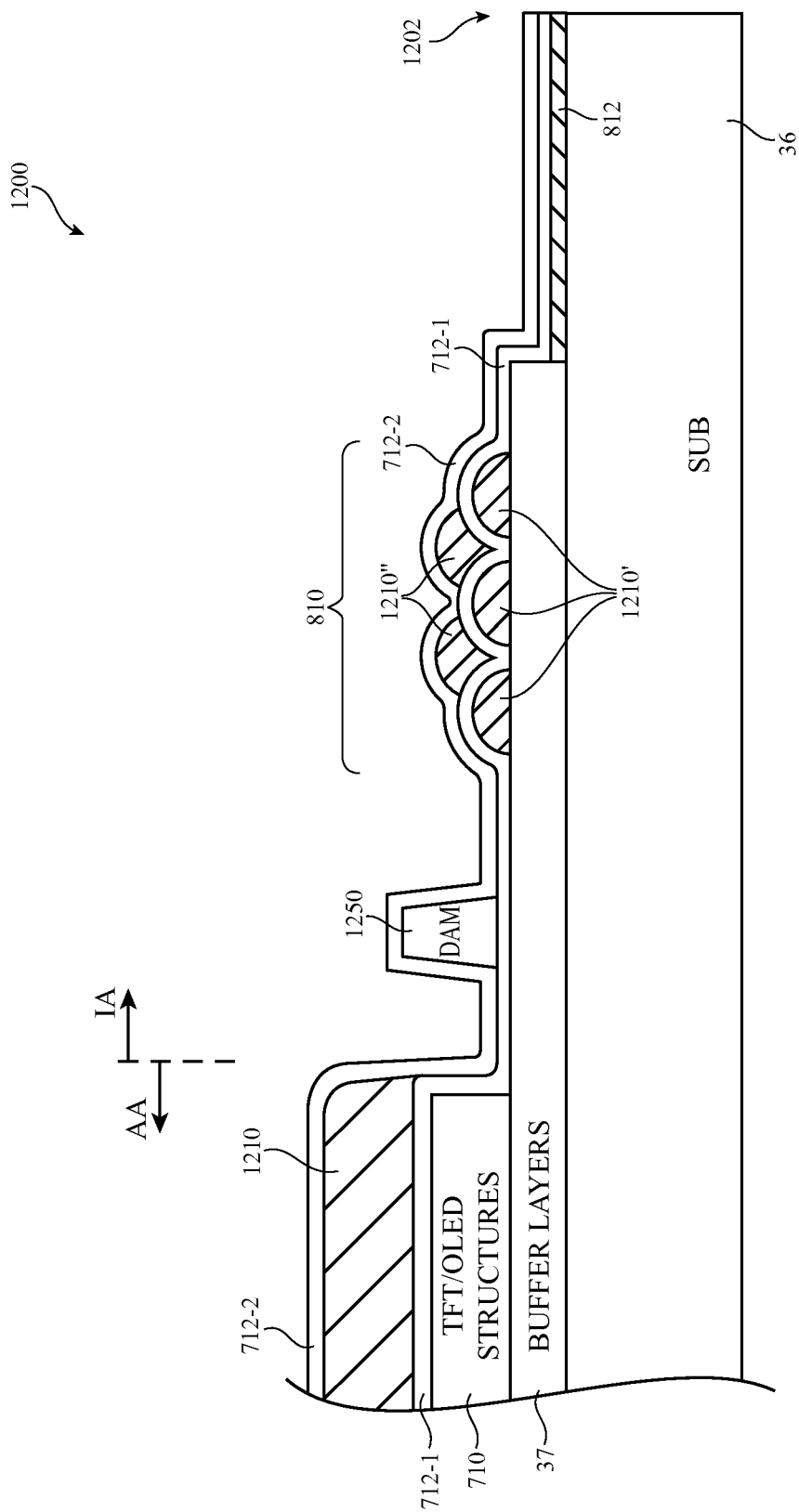
FIG. 12 is a cross-section al side view of illustrative crack stop structures formed using patterned polymer material that is integrated with inorganic encapsulation layers in accordance with an embodiment.

The embodiments described thus far relating to crack stop structures are formed using the TFT and OLED layers. If desired, the crack stop structures may also be formed using polymer material that is formed after the TFT and OLED layers. FIG. 12 is a cross-sectional side view of illustrative crack stop structures formed using patterned polymer material that is integrated with inorganic encapsulation layers in accordance with an embodiment.

As shown in FIG. 12, a first array of polymer structures 1210' may be formed directly on buffer layers 37 in the inactive area. A first inorganic encapsulation layer 712-1 (e.g., a first silicon nitride passivation layer) may be formed over the TFT/OLED structures 710 and first array 1210'. Polymer material 1210 may then be formed directly above the TFT/OLED structures 710 in the active region. In general, it may be desirable to have polymer material 1210 stay entirely within the active display area. To prevent polymer from overflowing into the inactive area, blocking structures such as dam structures 1250 may be formed surrounding polymer material 1210.

A second array of polymer structures 1210" may be formed over the first array on the first encapsulation layer 712-1. The second array of polymer structures 1210" may be formed at the same time as polymer 1210 (i.e., from the same material) or may be formed as a separate step (e.g., from the same or potentially different polymer materials). Thereafter, a second inorganic encapsulation layer 712-2 (e.g., a second silicon nitride passivation layer) may be formed over polymer material 1210, dam structures 1250, and the second array of polymer structures 1210".

The first polymer array and the second polymer array may be staggered with respect to one another to serve as non-homogenous crack stop structures 810. Since polymers cannot be patterned using photolithographic techniques, the first and second array of polymers may be patterned using an ink-jet printing process to form hemispheres (as shown in the example of FIG. 12). The first and second array of polymer structures 1210' and 1210" may be formed using organic material such as acrylic or epoxy or even a mixture of organic and inorganic materials. As shown in FIG. 12, adhesion layer 812 may also be used to strengthen the interface between encapsulation layer 712-1 and substrate 36.

Figure 13:
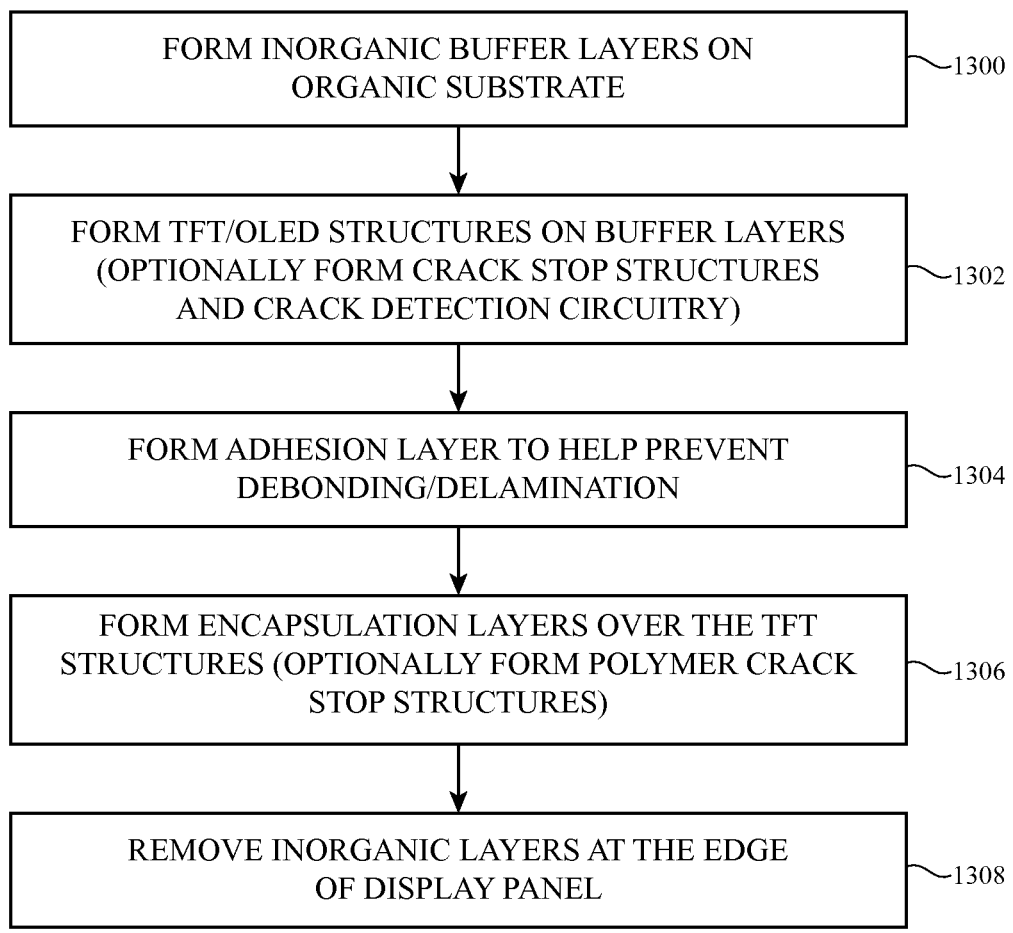
FIG. 13 is a flow chart of illustrative steps for forming an organic light-emitting diode display with crack prevention structures and/or crack detection circuitry in accordance with an embodiment.

FIG. 13 is a flow chart of illustrative steps for forming an organic light-emitting diode display with crack prevention structures and/or crack detection circuitry. At step 1300, inorganic buffer layers may be formed on the organic substrate (e.g., a polyimide substrate). At step 1302, the TFT/OLED structures may be formed on the buffer layers. During this step, the crack stop structures of the type described in connection with FIGS. 8-11 and/or crack detection circuitry of the type described in connection with FIGS. 5A and 5B may also be formed from the TFT/OLED layers. At step 1304, an adhesion layer may be formed on the substrate to help prevent debonding/delamination for subsequent layers that are formed over the substrate.

At step 1306, the inorganic encapsulation layers (e.g., the SiN passivation layers) may be formed over the TFT/OLED structure. As described above in connection with FIG. 12, polymer material may also be formed in the active area between two or more SiN passivation layers. During these steps, polymer-based crack stop structures of the type shown in FIG. 12 may optionally be formed.

At step 1308, at least a portion of the inorganic encapsulation layers and/or the buffer layers may be etched away at the edge of the display panel to help reduce stack height at the edge and to help mitigate the propagation of edge defects into the active display area (as described in connection with at least FIGS. 7 and 8). If desired, an additional polymer overcoat layer may be formed over part of all of the display to help protect the inorganic encapsulation layers from damage. This additional overcoat can also help prevent crack initiation due to the mechanical support it provides to the encapsulation layers.

The steps of FIG. 13 are merely illustrative and are not intended to limit the scope of the present invention. If desired, the steps may be modified or rearranged, steps may be skipped, or steps may be added while still achieving the intended result.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   a substrate;
   a plurality of pixels formed over the substrate and in an active area of the display; and
   crack stop structures that are formed on the substrate and in an inactive area of the display, wherein the crack stop structures are configured to prevent a crack at an edge of the display from propagating into the active area, and wherein the crack stop structures are formed from thin-film transistor structures arranged in a staggered configuration.

2. The display defined in claim 1, wherein the thin-film transistor structures comprise organic light-emitting diode (OLED) structures arranged in the staggered configuration.

3. The display defined in claim 1, further comprising:
   blanket inorganic encapsulation layers that are formed on the crack stop structures.

4. The display defined in claim 1, further comprising:
   a plurality of non-overlapping discrete inorganic encapsulation films that are formed on the crack stop structures.

5. The display defined in claim 1, further comprising:
   an adhesion layer that is formed directly on the substrate; and
   inorganic encapsulation layers that are formed directly on the adhesion layer.

6. The display defined in claim 1, wherein the crack stop structures comprise first crack stop structures and second crack stop structures that are separate from the first crack stop structures.

7. A display, comprising:
   a substrate;
   a plurality of pixels formed over the substrate and in an active area of the display;
   crack stop structures that are formed on the substrate and in an inactive area of the display, wherein the crack stop structures are configured to prevent a crack at an edge of the display from propagating into the active area, and wherein the crack stop structures comprise a column structure formed from thin-film transistor structures.

8. The display defined in claim 7, wherein the crack stop structures further comprises:
   an additional column structure formed from the thin-film transistor structures; and
   polymer filler material interposed between the column structure and the additional column structure.

9. A display, comprising:
   a substrate;
   a plurality of pixels formed over the substrate and in an active area of the display; and
   crack stop structures that are formed on the substrate and in an inactive area of the display, wherein the crack stop structures are configured to prevent a crack at an edge of the display from propagating into the active area, and wherein the crack stop structures comprise:
a first array of polymer structures;
a second array of polymer structures that is staggered with respect to the first array of polymer structures;
a first inorganic encapsulation layer that is interposed between the first array of polymer structures and the second array of polymer structures; and
a second inorganic encapsulation layer that is formed on the second array of polymer structures.

10. A method for manufacturing a display, comprising:
forming organic light-emitting diodes over a substrate;
forming inorganic layers that extend to an edge of the display; and
removing a portion of the inorganic layers at the edge of the display to help prevent cracks from propagating from the edge of the display to the organic light-emitting diodes, wherein removing the portion of the inorganic layers at the edge of the display comprises etching away a portion of inorganic buffer layers formed directly on the substrate and a portion of inorganic encapsulation layers that are at least partially formed over the organic light-emitting diodes.

11. The method defined in claim 10, further comprising:
forming crack stop structures at the edge of the display, wherein the crack stop structures includes thin-film transistor (TFT) circuitry and organic light-emitting diode (OLED) circuitry.

12. The method defined in claim 10, wherein forming the crack stop structures comprises forming at least first and second non-continuous crack stop structures at the edge of the display.

13. The method defined in claim 10, further comprising:
forming an adhesion layer directly on the substrate; and
forming at least one of the inorganic layers directly on the adhesion layer.

14. The method defined in claim 10, further comprising:
forming crack detection features along the edge of the display, wherein the crack detection features yield a first measured value when a crack is present and a second measured value that is different than the first measured value when the crack is absent.

15. An electronic device display, comprising:
a display driver circuit;
an array of organic light-emitting diodes formed within an active display region of the display; and
crack detection circuitry that is formed along at least one edge of the display and that is coupled to the display driver circuit, wherein the crack detection circuitry comprises:
a first sensing path that is formed along a first edge of the display and that is configured to detect for the presence of a crack along the first edge; and
a second sensing path that is formed along a second edge of the display and that is configured to detect for the presence of a crack along the second edge, wherein the first and second sensing paths are separate paths.

16. The electronic device display defined in claim 15, wherein the first and second sensing paths comprise loops.

17. The electronic device display defined in claim 15, wherein display driver circuit is configured to power off the display in response to detecting a crack along the at least one edge of the display.

18. The electronic device display defined in claim 15, further comprising:
crack stop structures formed along the at least one edge of the display, wherein the crack stop structures are configured to prevent a crack at the at least one edge of the display from propagating into the active display region, and wherein the crack detection circuitry is formed as an integral part of the crack stop structures.

* * * * *